USO12159950B2

United States Patent
Datta et al.

(10) Patent No.: US 12,159,950 B2
(45) Date of Patent: Dec. 3, 2024

(54) HALIDE-SEMICONDUCTOR RADIATION DETECTOR

(71) Applicant: CapeSym, Inc., Natick, MA (US)

(72) Inventors: Amlan Datta, Ashland, MA (US); Shariar Motakef, Weston, MA (US)

(73) Assignee: CapeSym, Inc., Natick, MA (US)

( * ) Notice: Subject to any disclaimer, the term of this patent is extended or adjusted under 35 U.S.C. 154(b) by 261 days.

(21) Appl. No.: 17/862,910

(22) Filed: Jul. 12, 2022

(65) Prior Publication Data

US 2022/0344525 A1 Oct. 27, 2022

Related U.S. Application Data

(63) Continuation-in-part of application No. 16/846,548, filed on Apr. 13, 2020, now Pat. No. 11,409,008.

(51) Int. Cl.
H01L 31/00 (2006.01)
H01L 31/0216 (2014.01)
(Continued)

(52) U.S. Cl.
CPC .... *H01L 31/0321* (2013.01); *H01L 31/02161* (2013.01); *H01L 31/022408* (2013.01);
(Continued)

(58) Field of Classification Search
CPC ........... H01L 31/0321; H01L 31/02161; H01L 31/022408
See application file for complete search history.

(56) References Cited

U.S. PATENT DOCUMENTS 9,391,287 B1 7/2016 Huang et al.
10,797,250 B2 * 10/2020 Kim ..................... H10K 85/342
(Continued)

OTHER PUBLICATIONS

Wiley Alfred Dunlap-Shohl, Novel Fabrication Approaches for Optoelectronic Halide Semiconductor Thin Films and Devices, Department of Mechanical Engineering and Materials Science, Duke University, 2019. (Year: 2019).*

(Continued)

*Primary Examiner* — Hugh Maupin
(74) *Attorney, Agent, or Firm* — Modern Times Legal; Robert J. Sayre

(57) ABSTRACT

A radiation detector includes a halide semiconductor sandwiched between a cathode and an anode and a buffer layer between the halide semiconductor and the anode. The anode comprises a composition selected from: (a) an electrically conducting inorganic-oxide composition, (b) an electrically conducting organic composition, and (c) an organic-inorganic hybrid composition. The buffer layer comprises a composition selected from: (a) a composition distinct from the composition of the anode and including at least one other electrically conducting inorganic-oxide composition, electrically conducting organic composition, or organic-inorganic hybrid composition; (b) a semi-insulating layer selected from: (i) a polymer-based composition; (ii) a perovskite-based composition; (iii) an oxide-semiconductor composition; (iv) a polycrystalline halide semiconductor; (v) a carbide, nitride, phosphide, or sulfide semiconductor; and (vi) a group II-VI or III-V semiconductor; and (c) a component metal of the halide-semiconductor.

32 Claims, 4 Drawing Sheets

(51) Int. Cl.
  *H01L 31/0224* (2006.01)
  *H01L 31/032* (2006.01)
  *H01L 31/036* (2006.01)
  *H01L 31/108* (2006.01)
  *H01L 31/0256* (2006.01)

(52) U.S. Cl.
  CPC .......... *H01L 31/036* (2013.01); *H01L 31/108* (2013.01); *H01L 2031/0344* (2013.01)

(56) References Cited

U.S. PATENT DOCUMENTS

| | | | |
|---|---|---|---|
| 2005/0056829 A1* | 3/2005 | Green | H01L 31/115 |
| | | | 257/E31.086 |
| 2007/0090341 A1* | 4/2007 | Itoh | C30B 29/12 |
| | | | 257/E21.462 |
| 2013/0026364 A1 | 1/2013 | Conway et al. | |
| 2015/0014627 A1* | 1/2015 | Yu | H01L 31/046 |
| | | | 257/77 |
| 2016/0013434 A1 | 1/2016 | Snaith et al. | |
| 2016/0248028 A1* | 8/2016 | Huang | C30B 29/54 |
| 2018/0308998 A1 | 10/2018 | Swelm et al. | |
| 2019/0097144 A1 | 3/2019 | Huang et al. | |
| 2020/0209415 A1 | 7/2020 | Veale | |
| 2020/0343053 A1* | 10/2020 | Lunt | H01G 9/2009 |
| 2023/0082682 A1* | 3/2023 | Chen | C23C 14/243 |
| | | | 136/256 |
| 2023/0104959 A1* | 4/2023 | Gelinck | H01L 27/14683 |
| | | | 250/366 |

OTHER PUBLICATIONS

A. Datta, et al., "Stable Room-Temperature Thallium Bromide Semiconductor Radiation Detectors," 5 APL Mater. 106109 (Oct. 31, 2017).

A. Datta, et al., "Novel Electrodes and Engineered Interfaces for Halide-Semiconductor Radiation Detectors," 9 Sci. Rep. 9933 (Jul. 9, 2019).

A. Conway, et al., "Fabrication Methodology of Enhanced Stability Room Temperature TlBr Gamma Detectors," 60 IEEE Transactions on Nuclear Science 1231-1236 (Apr. 2013).

K. Hitomi, et al., "Polarization Phenomena in TlBr Detectors," 56 IEEE Transactions on Nuclear Science 1859-1862 (Aug. 2009).

B. Donmez, et al., "The Stability of TlBr Detectors at Low Temperature", 623 Nuclear Instruments and Methods in Physics Research A 1024-1029 (Sep. 4, 2010).

* cited by examiner

HALIDE-SEMICONDUCTOR RADIATION DETECTOR

BACKGROUND

The discussion of the background state of the art, below, may reflect hindsight gained from the disclosed invention(s); and these characterizations are not necessarily admitted to be prior art.

Halide semiconductors are a family of materials with applications including detection of radiation over a large range of energies of the incident radiation. Examples of these semiconductors include $HgI_2$, $PbI_2$, $TlBr$, $CsPbBr_3$, and halide perovskites, such as $MAPbI_3$ and $CsPbBr_3$. In these detectors, the incident radiation creates electron-hole pairs in the halide semiconductor by the photoelectric effect. Application of an electric bias to the detector directs the electrons and holes to the corresponding electrodes, resulting in an electronic charge in the electrodes and which signals detection of incident radiation. This electronic transport (referred to as electromigration) in the halide semiconductor is often accompanied by transport of negatively charged halide ions to the positive-biased electrode (anode). The halide ions accumulate at the anode and react with at least the metallic anode, resulting in rapid degradation of the semiconductor detector performance and its failure.

SUMMARY

A radiation detector and a method for detecting radiation with the detector are described herein, where various embodiments of the apparatus and methods may include some or all of the elements, features and steps described below.

The radiation detector can include a halide semiconductor, a cathode attached at a first side of the halide semiconductor, an anode attached at a second side of the halide semiconductor such that the halide semiconductor is sandwiched between the cathode and the anode, and a buffer layer between the halide semiconductor and the anode. The anode comprises a composition selected from the following:
a) an electrically conducting inorganic-oxide composition;
b) an electrically conducting organic composition; and
c) an organic-inorganic hybrid composition; and
Meanwhile, the buffer layer comprises a composition selected from the following:
a) a composition distinct from the composition of the anode and including at least one other electrically conducting inorganic-oxide composition, electrically conducting organic composition, or organic-inorganic hybrid composition;
b) a semi-insulating layer selected from:
  i) a polymer-based composition;
  ii) a perovskite-based composition;
  iii) an oxide-semiconductor composition;
  iv) a polycrystalline halide semiconductor;
  v) a carbide, nitride, phosphide, or sulfide semiconductor; and
  vi) a group II-VI or III-V semiconductor; and
c) a component metal of the halide semiconductor.

A method for detecting radiation can include receiving radiation with a radiation detector, as described above. The incident radiation is captured with the halide semiconductor to generate electron-hole pairs via a photoelectric effect. An electric bias is applied across the halide semiconductor via generation of a voltage potential between the anode and the cathode across the halide semiconductor to direct electrons to the anode and to direct holes to the cathode. A change in an electronic charge is then detected in at least one of the anode and cathode, and the incidence of radiation in the halide semiconductor is identified based on the detected change in radiation.

Halide semiconductor devices with electrode structures that are not affected (or less affected) by the electromigration of charged halide ions are described herein. The lifetime of radiation detectors made with these electrode structures can, accordingly, be significantly extended.

Figure 1:
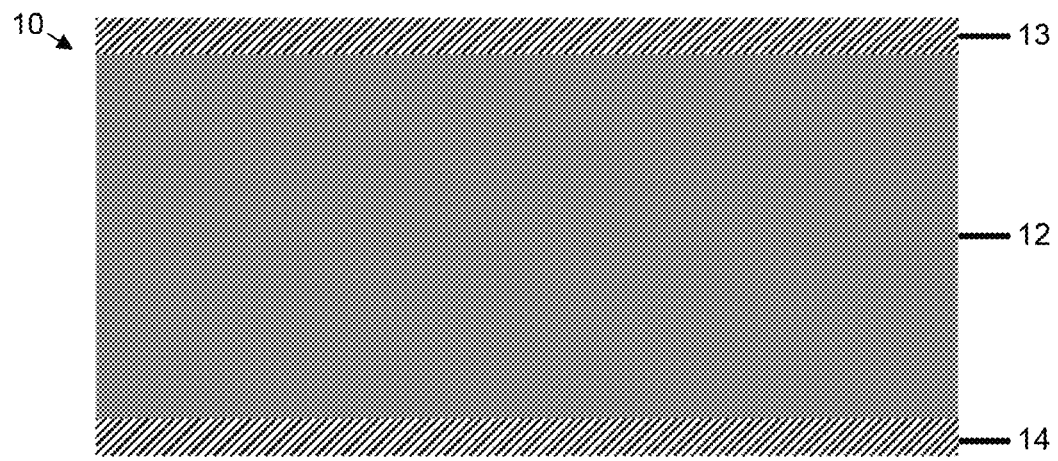
FIG. 1 is a schematic illustration of a halide semiconductor device with a non-reactive electrode.

In the accompanying drawings, like reference characters refer to the same or similar parts throughout the different views; and apostrophes are used to differentiate multiple instances of the same item or different embodiments of items sharing the same reference numeral. The drawings are not necessarily to scale; instead, an emphasis is placed upon illustrating particular principles in the exemplifications discussed below. For any drawings that include text (words, reference characters, and/or numbers), alternative versions of the drawings without the text are to be understood as being part of this disclosure; and formal replacement drawings without such text may be substituted therefor.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise herein defined, used or characterized, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially (though not perfectly) pure, as practical and imperfect realities may apply; e.g., the potential presence of at least trace impurities (e.g., at less than 1 or 2%) can be understood as being within the scope of the description. Likewise, if a particular shape is referenced, the shape is intended to include imperfect variations from ideal shapes, e.g., due to manufacturing tolerances. Percentages or concentrations expressed herein can be in terms of weight or volume. Processes, procedures and phenomena described below can occur at ambient pressure (e.g., about 50-120 kPa—for example, about 90-110 kPa) and temperature (e.g., −20 to 50° C.—for example, about 10-35° C.) unless otherwise specified.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly. The term, "about," can mean within ±10% of the value recited. In addition, where a range of values is provided, each subrange and each individual value between the upper and lower ends of the range is contemplated and therefore disclosed.

Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as those introduced with the articles, "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Figure 2:
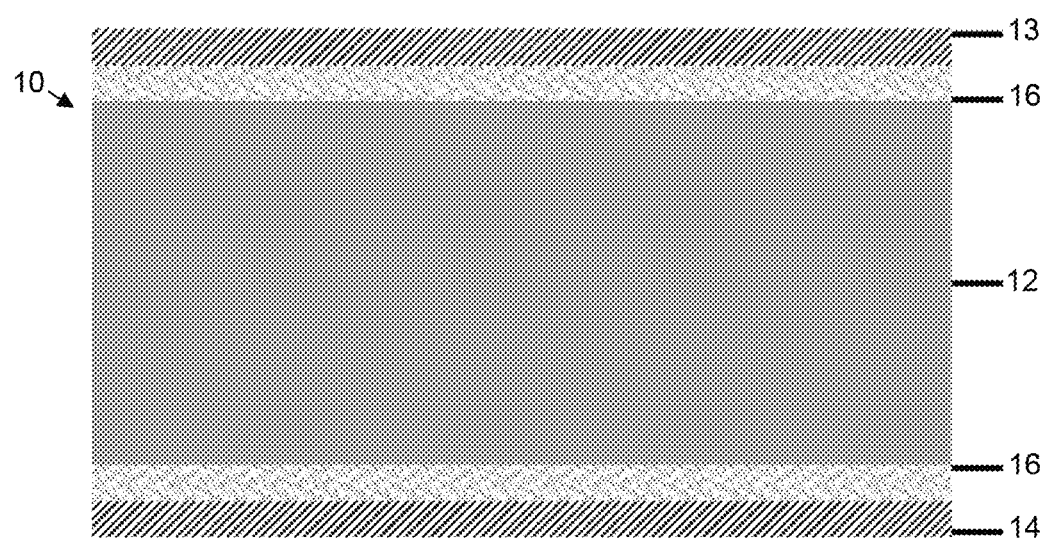
FIG. 2 is a schematic illustration of a halide semiconductor device with a buffer layer and a non-reactive or metal electrode.
Figure 3:
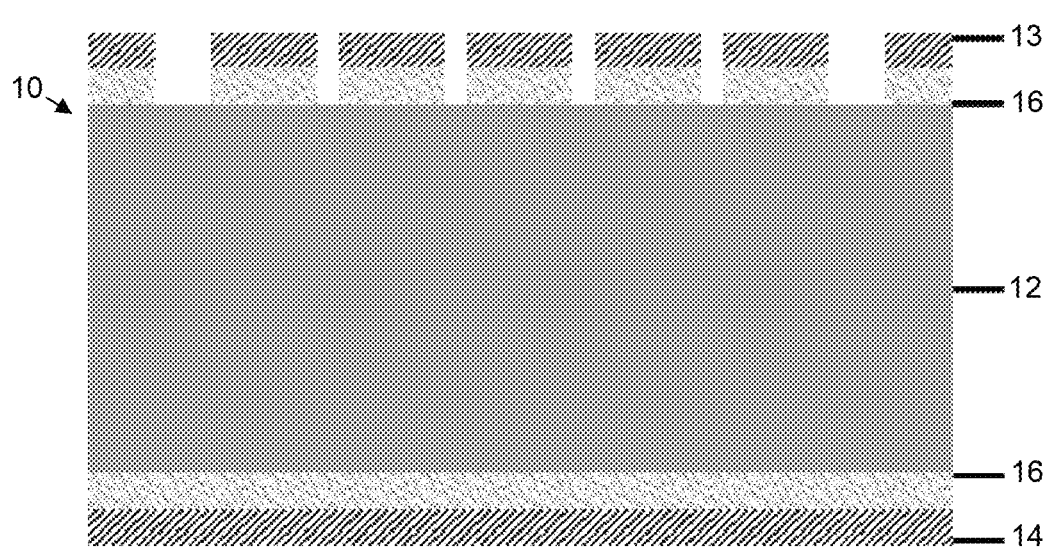
FIG. 3 is a schematic illustration of a halide semiconductor device with a buffer layer and a segmented anode.

Halide semiconductor devices can be used for detection of gamma-ray, x-ray, neutron, and solar radiation. As shown in FIG. 2, these detector devices comprise a semiconductor matrix 12 that is sensitive to the incident radiation and electrodes that create an electric field in the semiconductor 12. The photoelectric interaction of the incident radiation with the semiconductor matrix 12 generates electrons and holes that drift under the electric field in the semiconductor 12 to the anode 13 and cathode 14, respectively. The morphology of the anode 13 layer can be continuous, as shown in FIG. 2, or segmented, as shown in FIG. 3. Continuous anodes 13, as shown in FIG. 2, cover the entire surface of the semiconductor 12 over which charge collection is designed to occur. Examples of detectors with continuous anodes are what are referred to in the trade as planar and virtual Frisch-grid detectors. Segmented anodes 13, as shown in FIG. 3, partially cover the area of the semiconductor 12 over which charge collection is designed to take place. Examples of segmented anodes include pixelated, strip and patterned anodes, as used in pixelated detectors; strip detectors; and co-planar grid detectors, respectively.

The electrodes 13 and 14 are generally made from metals, such as Cr, Au, Ag, and Pt. In halide semiconductors 12, the negatively charged halide ions are generally more mobile; and they drift towards the anode (via a process referred to as electromigration) and chemically react with the metallic contacts, resulting in failure of the device 10. As is further described, below, electrode structures (particularly, that of the anode 13) are provided with one or more buffer layers 16 that do not react with the incoming stream of halide ions.

The discussion, below, is further directed to the identification of non-reactive conductive electrodes 13 and 14 and buffer layers 16 that can be placed between the halide semiconductor 12 and conductive electrodes 13 and 14. We have practiced this methodology by developing TlBr radiation detectors based on a number of electrode structures described herein. The lifetime of radiation detectors with these electrode structures has been extended beyond measure over our test period, whereas devices made with metallic electrodes do not last more than tens of days of operation.

This discussion can apply to radiation-detection devices including halide semiconductors, such as TlX, $BiX_3$, $HgX_2$, and perovskites $ABX_3$, where A=a metal, such as Cs, and/or conjugate acid of protonated amines, such as methylammonium or formamidinium ions; B=a metal, such as Pb, Sn, Cu, Ni, Bi, Co, Fe, Mn, Cr, Cd, Ge, or Yb; and X=Cl, Br, and I, or mixtures thereof.

In additional exemplifications, the halide component is represented by the chemical formula, $ABX_3$, where A is a cation, where B is at least one divalent metal cation, and where X is selected from at least one of Cl, Br, and I. The A component of $ABX_3$ can be an aliphatic ammonium, an aromatic ammonium, or a metal ion. In additional exemplifications, A is cesium ion (CO. On the other hand, the B component of $ABX_3$ can be $Bi^{2+}$, $Cu^{2+}$, $Ni^{2+}$, $Co^{2+}$, $Fe^{2+}$, $Cr^{2+}$, $Pd^{2+}$, $Cd^{2+}$, $Ge^{2+}$, $Sn^{2+}$, $Pb^{2+}$, $Eu^{2+}$, and/or $Yb^{2+}$. In particular exemplifications, $ABX_3$ is cesium lead bromide ($CsPbBr_3$) and/or methylammonium lead bromide ($MAPBr_3$).

Herein, we refer to thallium bromide (TlBr) as a representative material of the halide material family. However, such reference is only for ease in communication and is not intended to exclude other materials in this family. Halide semiconductors have applications in the detection of gamma, alpha, neutron, x-ray, and solar radiation. Purification of precursor materials over the last decade has substantially increased the carrier lifetime and, therefore, the performance of halide radiation detectors.

In semiconductor radiation detectors 10, as shown in FIG. 1, an electric bias is imposed on the detector material through electrodes 13 and 14 that contact the semiconductor 12. Once a radiation photon (e.g., a gamma ray) impinges on the detector and is absorbed within the detector, a number of electron-hole pairs are produced in the semiconductor 12—i.e., the so-called ionizing radiation event. The electrons and holes drift under the applied electric field towards the anode 13 and cathode 14, respectively. The presence of the electrons and holes is detected at the electrodes 13 and 14, and a signal is captured until such time that the electrons (holes) reach the anode 13 (cathode 14).

A major factor impeding the use of halide-semiconductor radiation detectors is the electro-diffusion of the halide ions (Cl⁻, Br⁻, I⁻) towards the anode 13. The negatively charged halide ions are generally several orders of magnitude more mobile than the positively charged counterparts (e.g., Tl⁺) and are believed to drift under the applied electric field by hopping through vacancies in the semiconductor lattice 12. The detector electrodes 13 and 14 are made out of metals, such as Pt, Pd, or Au, and are deposited onto the semiconductor 12 by any of a variety of techniques. The applied electric field in the detector created to direct and collect electrons and holes associated with the ionization radiation event also sets up a continuous flow of halide ions towards the anode 13. The halide ions react with the metallic anode 13 and produce a metal halide (e.g., gold-bromide). With time, the metal anode 13 chemically reacts with the halide ions and becomes eroded. At some point, the anode 13 stops establishing electric bias in the detector and the detector fails. For example, in the case of TlBr, the electro-diffusion of Br⁻ ions towards the anode metal results in rapid deterioration of the contact resulting in a short device lifetime on the order of several days.

A number of remedies have been developed to counteract the effect of the reaction of halide ions with the electrodes. First, by lowering the device temperature, for example, to −20° C. for TlBr, the electro-diffusion of Br⁻ and the metal-Br⁻ reaction are slowed down, leading to a significant increase in the device lifetime; see B. Donmez, et al., "The stability of TlBr detectors at low temperature," 623 Nucl. Inst. Meth. Phys. Res. A. 1024 (2010). The second approach involves etching the semiconductor surface by a halide acid to produce a thin buffer before applying the contact metal. The halide acid is believed to retard the diffusion of charged ions and reduce the erosion rate of the contact metal. For example, HCl etching of TlBr surfaces and creation of a thin $TlBr_xCl_{1-x}$ layer has been shown to increase the room-temperature detector lifetime to 60 days, versus several days for a similarly fabricated device without HCl etching; see A. M. Conway, et al., "Fabrication Methodology of Enhanced Stability Room Temperature TlBr Gamma Detectors," 60 IEEE Trans. Nucl. Sci. 1231 (2013). The third approach is to use Tl as the contact metal; see K. Hitomi, et al., "Polarization Phenomena in TlBr Detectors," 56 IEEE Trans. Nucl. Sci. 1859 (2009). In a fourth approach, a team including the present inventors has shown that, by periodic switching of the bias on a TlBr detector, the detector lifetime can be increased to years; see A. Datta, J. Fiala, P. Becla, & S. Motakef, et al., "Stable room-temperature thallium bromide semiconductor radiation detectors," 5 Appl. Phys. Lett. Mater. 106109 (2017).

The following sections are directed to materials selected for use directly as the electrode or used as a buffer layer between the halide semiconductor and the metallic electrode; these materials do not react, or react extremely slowly, with the halide ions. At the same time, they do not have a deleterious effect on charge collection during ionizing-radiation events. Examples of materials that can be used with halide crystals and that are not prone to reaction with halide ions, as described above, are listed, below.

Buffer-Layer-Protected Electrodes for Hybrid Halide Semiconductor Radiation Detectors:

Non-Reactive Electrically Conductive Electrodes:

First, non-reactive electrically conductive electrodes can include inorganic oxide conducting layers and/or organic electrically conducting layers. In various exemplifications, where an electrode includes an inorganic conducting layer, its composition can include any of the following:

$(In_2O_3)_x$—$(SnO_2)_y$ (where x and y each are in a range from 0-1);

fluorine-doped tin oxide (FTO);

$Sn_2O_3$ (with dopant: F, Mo, Zr, Pt, or W);

zinc oxide (with dopant: Al, Na, Mo, or Mn);

$A_xO_y$ (where A: Li, Na, Mg, Al, K, Ca, Ti, V, Cr, Mn, Co, Ni, Cu, Zn, Ga, Sr, Y, Zr, Nb, Mo, Ru, Ta, W, Pt, Hg, La, Ce, Sm, Eu, Gd, or Dy, and where x=1 or 2, and where y=1, 2, or 3);

NiO (with dopant: Li);

$TiO_2$ (with dopant: Nb);

$Cr_2O_3$ (with dopant: Mg or N);

$CuCrO_2$ (with dopant: Mg);

$Mg_{1-x}Zn_xO$ (with dopant: Al or In);

$A_xB_yO_z$ (where A=Cu, Ag, Pd, Pt; B=Fe, Co, Cr, Sr, Ba, Al, Ga, In, Sc, Y, or La, and where the dopant is Ca, Mg, K, or Sn);

$CuA_xSb_{1-x}O_y$ (where A=Mn, Co, Ni, Zn, or Mg); and $CuCr_{1-x}A_xO_2$.

In additional exemplifications, where an electrode includes an organic electrically conducting layer, its composition can include a conductive polymer, another conductive organic material, or an organic-inorganic hybrid. Examples of suitable conductive polymers include the following:

polyacetylene (dopants: $I_2$, $Br_2$, Li, Na, $AsF_5$);

poly(3-alkylthiophene) (dopants: $BF_4^-$, $ClO_4^-$);

polyphenylene vinylene (dopant: $AsF_5$);

polypyrrole (dopants: $BF_4^-$, $ClO_4^-$);

polythiophene (dopants: $BF_4^-$, $ClO_4^-$);
   a. including: metal-oxide doped (e.g., iron oxide, $MoO_3$) and undoped PEDOT:PSS or poly(3,4-ethylenedioxythiophene) polystyrene sulfonate, and
   b. P3HT or poly(3-hexylthiophene-2,5-diyl);

polyaniline (dopant: HCl);

polyphenylene (dopant: Na, Li, $AsF_5$);

polyphenylene sulfide (dopant: $AsF_5$);

polyfuran (dopants: $BF_4^-$, $ClO_4^-$);

polyazulene (dopants: $BF_4^-$, $ClO_4^-$);

poly(triaryl amine); or polystyrene.

Examples of organic-inorganic hybrid materials include nanocomposites in the form of nanoparticles of metals (such as Au or Ag), semiconductors, metal oxides, metal halides, and conducting polymers (such as poly(3-methylthiophene), also known as P3MeT).

Examples of other conductive organic materials include graphene and carbon nanotube (CNT) based conductive layers; fullerene ($C_{60}$) based conductive layers, including PCBM ([6,6]-phenyl C61 butyric acid methyl ester); and 2,2',7,7'-Tetrakis-(N,N-di-4-methoxyphenylamino)-9,9'-spirobifluorene (also known as Spiro-MeOTAD).

Buffer Layers:

Electrodes can be provided with a buffer layer coating via physical vapor deposition using thermal evaporation, sputtering, atomic layer deposition (ALD), etc., of the buffer-layer composition. In additional exemplifications, the buffer layer can be deposited via chemical vapor deposition using metalorganic chemical vapor deposition (MOCVD), molecular beam epitaxy (MBE), etc. In still additional embodiments, the buffer layer can be applied using a solution-based technique, such as spin coating, spray coating, doctor blading, inkjet deposition, etc.

Examples of suitable buffer layers for use between the semiconductor and a metallic electrode (with a composition selected from the above list but different from the composition of the electrode) include (a) a combination of conducting layers selected from the compositions listed, above, for the electrodes; and (b) semi-insulating layers. The semi-insulating layers can include polymers; perovskite-base layers; oxide semiconductors; halide semiconductors; carbon, nitride, phosphide, and sulfide semiconductors; or group II-VI and III-V semiconductors. Where the buffer layer is a halide semiconductor deposited on a halide-semiconductor electrode, the buffer layer can have a polycrystalline structure, while the underlying electrode can have a single-crystalline structure. Particular examples of suitable compositions for the buffer layer include carbides, such as SiC; nitrides, such as AlN, GaN, and InN; phosphides, such as InP; sulfides, such as PbS and CdS; Group II-VI compositions, such as CdTe, CdSe, ZnTe, and ZnSe; and Group III-V compositions, such as GaAs, BN, AlP, InP, and AlN.

Examples of suitable compositions for semi-insulating layers include polymers, such as polyimide; polybenzoxazole; polymethyl methacrylate (PMMA); polyvinyl toluene (PVT); and poly(p-xylylene) compositions including copolymers and nanocomposites (e.g., $SiO_2$/parylene C), polyacryloyl piperidine (PVP), polyethylene-based resin, a polypropylene-based resin, a cyclic polyolefin-based resin, a polystyrene-based resin, an acrylonitrile-styrene copolymer, an acrylonitrile-butadiene-styrene copolymer, a poly(vinyl chloride)-based resin, a fluorine-based resin, a poly(meth)acrylate-based resin, and a polycarbonate-based resin.

Examples of suitable compositions for perovskite-based layers include (a) perovskite semiconductors, such as $ABX_3$ (A being Cs, methyl ammonium or formamidinium; B being Pb, Sn, Cu, Ni, Bi, Co, Fe, Mn, Cr, Cd, Ge, or Yb; and X being Br, I, Cl, or combinations thereof); (b) polyimide-perovskite composites in the form of a polyimide matrix with interspersed semiconducting particles of perovskite semiconductors; (c) polystyrene-perovskite composites in the form of a polystyrene matrix with interspersed semiconducting particles of perovskite semiconductors; and (d) a conductive polymer (selected from the list provided above for the non-reactive electrically conductive electrodes)-perovskite composite in the form of a polymer matrix with interspersed semiconducting particles of perovskite semiconductors.

Examples of suitable oxide semiconductors include $TiO_2$, $Cu_2O$, CuO, $UO_2$, $UO_3$, $Bi_2O_3$, $SnO_2$, $BaTiO_3$, $SrTiO_3$, $LiNbO_3$, $La_2CuO_4$, $VO_2$, ZnO, and AZO. Meanwhile, examples of suitable halide semiconductors include $BiI_3$, $HgI_2$, and $PbI_2$.

TlBr radiation detectors have been fabricated from a number of materials from the above lists. TlBr detectors with buffer layers of $TiO_2$, $SnO_2$, and $In_2O_5Sn$ (ITO) have been produced and tested. Thin layers of $TiO_2$, $SnO_2$, and ITO (about 2-nm thick) were deposited on similar TlBr planar detectors, and a layer of In was deposited onto these layers. Gold wire was attached to the In metal and connected to the charge-collection electronics.

Figure 4:
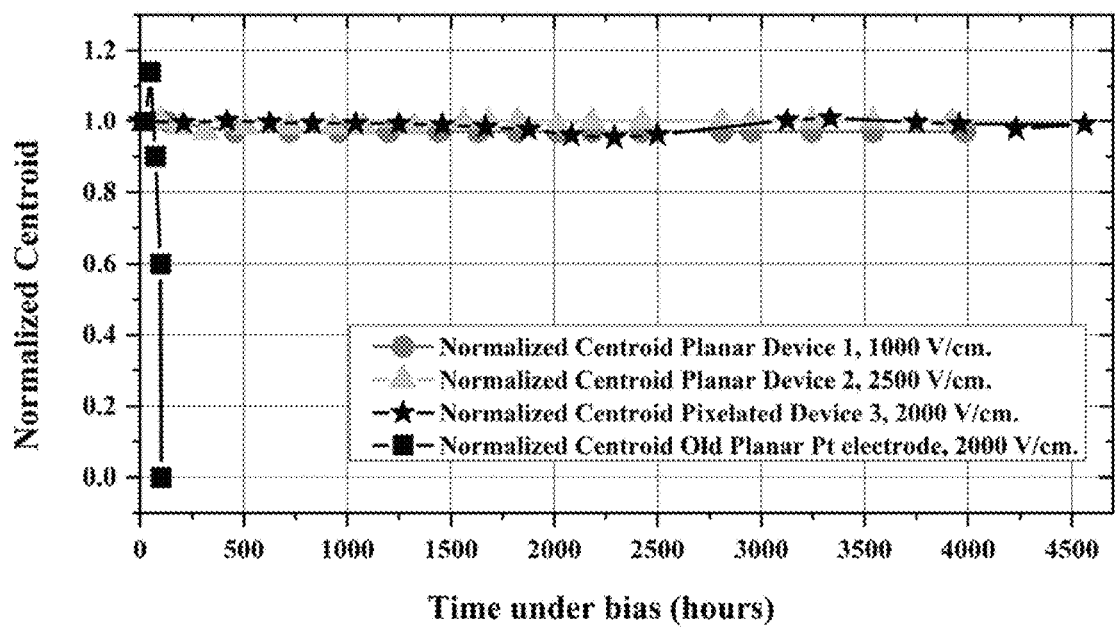
FIG. 4 is a display of the recorded counts per second and position of the energy centroid in TlBr detectors subjected to gamma irradiation from a Cs-132 source versus time. The TlBr detectors have the indicated materials as the buffer between TlBr and the In metallic electrode. The performance of a TlBr detector with Pt electrodes is also shown for purposes of comparison.

FIG. 4 shows the stability of the counts and the position of the energy peak (referred to as the centroid in the figure) of these detectors as a function of time. All parameters are normalized with respect to their value at the beginning of the measurement. The change in the first few hundred hours is a normal feature of TlBr detectors and is referred to as the "conditioning" period. The performance of detectors with the buffer layers is compared with that of a TlBr detector with a Pt contact.

The measurements shown in FIG. 4 were obtained under electric field strengths of 1000V/cm and 2500 V/cm. It can be readily observed that the detectors fabricated with buffer layers of $TiO_2$, $SnO_2$, and ITO have a very stable performance over the measurement period. Throughout testing, these devices have continued to perform as shown in FIG. 4. In contrast, the device that was fabricated without a buffer layer failed after ~100 hours.

The methods described herein enable the fabrication of semiconductor radiation detectors capable of providing stable long-term spectroscopic performance with or without an applied electric field. In some exemplifications, the semiconductor radiation detector can include one or more organic or inorganic cations and one or more halide anions. These materials can have symmetric or asymmetric crystallographic structures. An example of this class of materials is inorganic-organic ternary or quaternary ("double") halide perovskites with the structure $ABX_3$ or $A_2M^+M^{3+}X_6$, respectively, where A corresponds to organic cations ($Cs^+$, $CH_3(NH_2)_2^+$ ("FA"), $CH_3NH_3^+$ ("MA"), or a mixture thereof); B corresponds to inorganic cations ($Pb^{2+}$, $Sn^{2+}$); $M^+$ corresponds 1+ metals ($Cu^+$, $Ag^+$), $M^{3+}$ corresponds to 3+ metals ($Bi^{3+}$, $Sb^{3+}$, $In^{3+}$); and X corresponds to halide anions ($Cl^-$, $Br^-$, $I^-$, or a mixture thereof), respectively. Other examples include semiconductors, such as thallium bromide, mercuric iodide, and bismuth iodide. This composition may also include dopants of any concentrations, including an element, such as lithium-6, boron-10, or gadolinium, that has a high cross-section for absorption of neutrons.

The methods described herein further enable the fabrication of radiation detectors using these materials that are capable of producing spectroscopic information for the determination of the energy and type of the incoming radiation. One of the most important criteria for the determination of the spectroscopic information is the position of the radiation peak generated by the radiation detection electronics (analog or digital). Due to various factors, such as polarization induced by ionic movement, this radiation peak position shifts with time. This makes the spectroscopic information unusable and unreliable for long-term use.

The methods described herein still further enable the fabrication of radiation detectors using these materials such that the effects of polarization are either minimized or eliminated. The reduction or elimination in the effects of polarization can be achieved in different ways, including the following.

Figure 8:
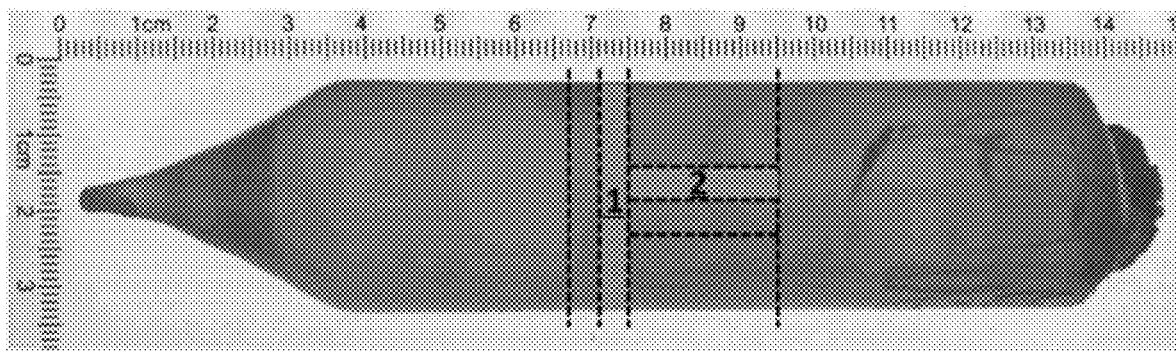
FIG. 8 is an image of a representative $CsPbBr_3$ crystal and schematic representation of the sectioning directions of samples for the fabrication of detectors.

The detector can be fabricated (which includes cutting and polishing, and may include etching and deposition of anode and cathode electrodes) from a crystalline slab where the slab planes onto which the electrodes are deposited and across which the bias is applied during device fabrication have specific crystallographic orientations. This crystallographic direction depends on the crystalline structure of the material. For example, as shown in FIG. 8, the detector numbered 2 is an advantageous orientation for a $CsPbBr_3$ crystal where the orientation of the growth direction is determined by the natural tendency of the crystal during self-seeding. The spectroscopic centroid provided by $CsPbBr_3$ semiconductors in response to $^{137}Cs$ gamma radiation demonstrates stable behavior when the detector is fabricated along the indicated direction. The detectors fabricated from crystals cut in this particular direction show no polarization effects. This lowest-polarization crystallographic orientation of the crystal slabs for detector fabrication (and along which the electric bias is applied) is associated with the bond lengths and relative position of the atoms within the crystallographic lattice and directions for minimal ionic diffusion and generation and propagation of crystalline and chemical defects.

In addition to or separate from the crystallographic direction, the detectors can be fabricated from crystals grown in a gas environment, which results in reduced vacancies and other ionic hopping pathways. As an example, the $CsPbBr_3$ semiconductor detectors fabricated from crystals grown under excess bromine conditions that were achieved by flowing hydrogen bromide (HBr) gas through and/or over the molten $CsPbBr_3$ material demonstrated lower polarization effects due to reduced Br-vacancies in the material. The lower density of Br-vacancies reduces suitable pathways for the movement of the Br-ions under an electric field, which in turn contributes to the polarization phenomenon. Halide ions, such as Br, intended for stoichiometry correction can be incorporated into the crystals by flowing an acid gas, such as HBr, through the molten $CsPbBr_3$.

In addition to or separate from crystallographic direction and/or certain stoichiometric variations, doping with particular materials decreases the effects of polarization. As an example, doping with $PbCl_2$ decreases the polarization effects in the $CsPbBr_3$ radiation detectors by passivating the defect propagation pathways along certain crystallographic directions. Additionally, the incorporation of TlBr in $CsPbBr_3$ softens the overall matrix, releasing the internal stress inside the crystal, thereby minimizing polarization induced by the residual stress inside the crystal. Cl and TlBr can be added separately or together and at various concentrations. The higher-concentration and non-halide dopants can be incorporated into the crystals by adding the precursors, such as $PbCl_2$ and TlBr, to the starting materials before melting them together.

In addition or separate from crystallographic direction and/or certain stoichiometric variations, doping with particular materials changes the bandgap of the semiconductor materials or the surface layers resulting in the minimization of polarization induced by charge accumulation near the Schottky barriers.

In addition or separate from crystallographic direction and/or certain stoichiometric variations and/or doping with particular materials, the anode and cathode material layers include one or more of the crystal constituents, such as matrix components, such as Pb, in the contact materials used with $CsPbBr_3$ crystals.

EXAMPLE

Figure 5:
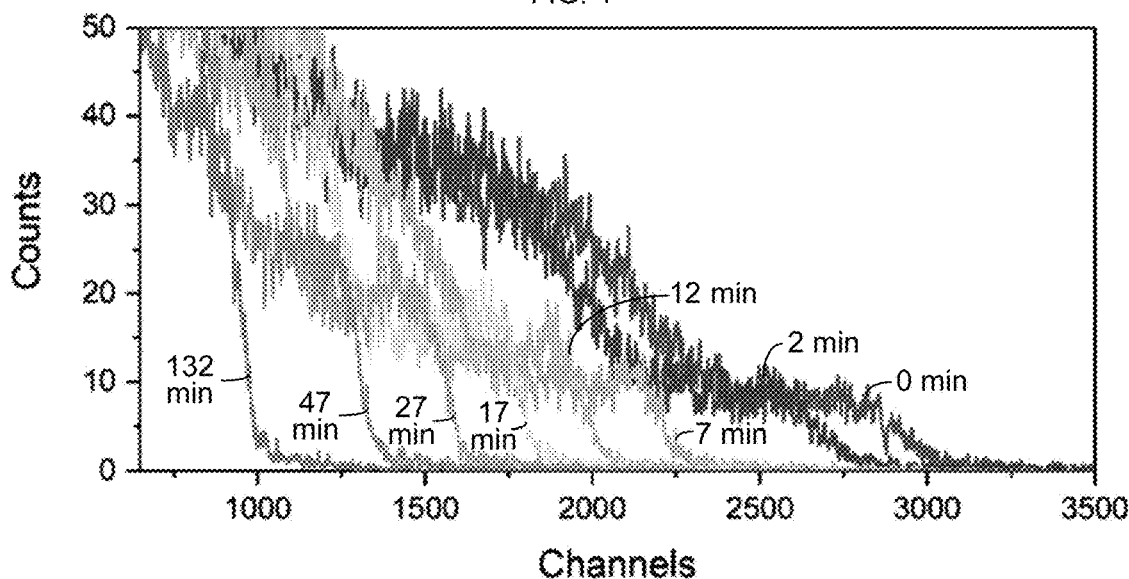
FIG. 5 plots the evolution of the gamma response of an unstable $CsPbBr_3$ detector upon steady application of bias.

In order to quantify the polarization effects for gamma spectroscopy, we performed stability tests where γ-response measurements were taken approximately every five minutes under identical conditions of gain, shaping time, and continuous application of voltage. Evolution of the gamma response of an unstable $CsPbBr_3$ detector upon steady application of bias is plotted in FIG. 5, where the time increments (in minutes) after the start of the experiment at which the measurements were taken are indicated with the reference numbers associated with each plot (i.e., at 0 minutes, at 2 minutes, at 7 minutes, at 12 minutes, at 17 minutes, at 27 minutes, at 47 minutes, and at 13 minutes). As depicted in FIG. 5, a continuous shift of the photopeak to lower channels was observed under constant experimental conditions. Interestingly, this phenomenon is reversible and repeatable. Once the application of bias is halted for a few hours, the photopeak returns to its original position; and the same trend is observed with the repeated application of bias on a similar time scale.

Figure 6:
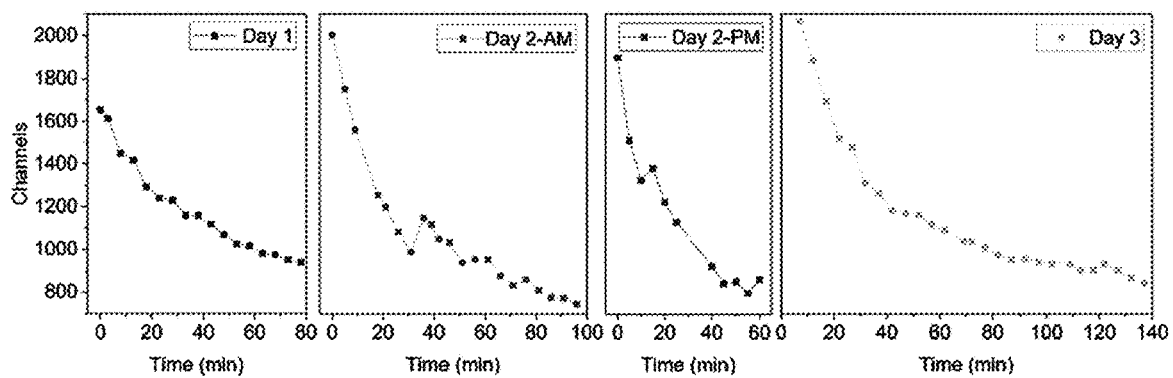
FIG. 6 plots the recovery in the 662 keV gamma centroid positions due to reversible polarization phenomena in an unstable $CsPbBr_3$ detector.
Figure 7:
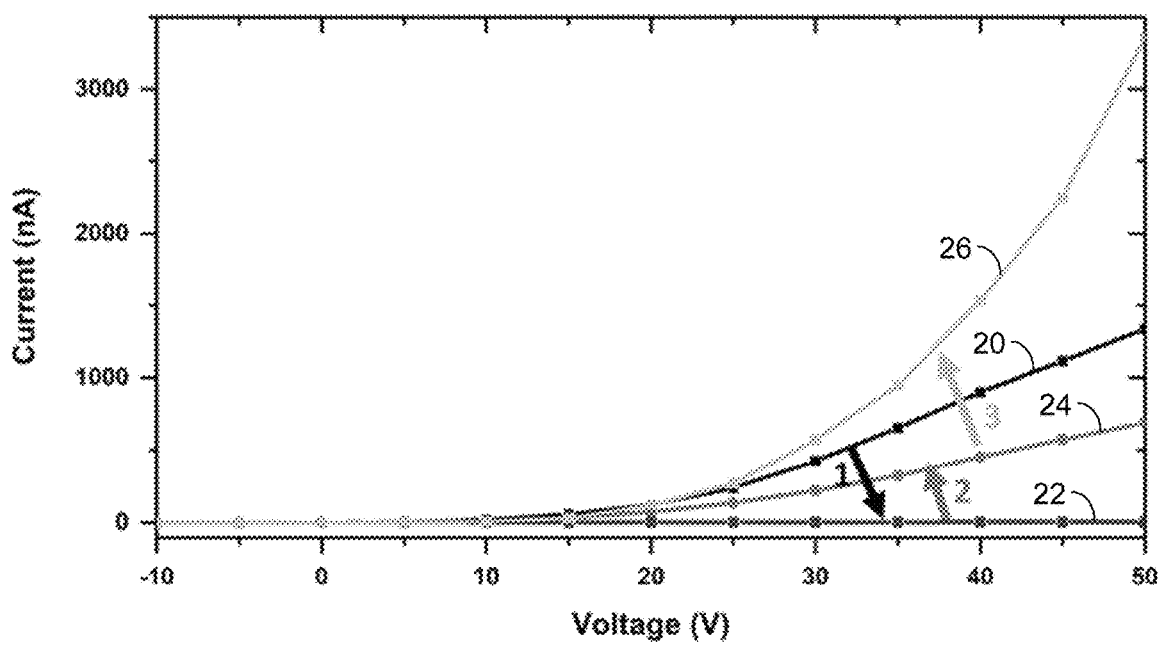
FIG. 7 includes plots showing changes in the Schottky current before and after reconditioning a detector, showing the reversible behavior of the polarization phenomena that results in the disappearance of the Schottky behavior of the $CsPbBr_3$ detectors with time.

Recovery in the 662 keV gamma centroid positions due to reversible ionic polarization phenomena in an unstable $CsPbBr_3$ detector is shown in FIG. 6, which shows the shifts in the centroid position with time for the same detector repeatedly biased and turned off in regular intervals over three days [from left-to-right: (a) day 1, (b) day 2—a.m., (c) day 2—p.m., and (d) day 3]. The shifts in the current-voltage properties were also periodically monitored to gain insight into the polarization phenomena of the $CsPbBr_3$ detectors. It was observed that the Schottky character of the semiconductor-to-metal junction changed over time depending on the direction of the applied bias. FIG. 7 shows the changes in the Schottky behavior along with the different relevant biasing conditions (a) for a fresh device 20, (b) after one hour of spectroscopic testing 22, (c) after one hour of reconditioning 24, and (d) after 1.5 hours of additional reconditioning 26. After the fresh device 20 was biased for an hour for spectroscopic testing 22, the Schottky current was highly denounced due to the lowering of the electric field inside the detector. Once the bias is reversed for an hour 24, the electric field slightly recovers, and the Schottky current goes up. After additional time in reverse bias 26, the current surpasses the original value indicating polarization in the opposite direction.

As a solution to this polarization phenomenon, the biasing direction with respect to the crystallographic planes of the $CsPbBr_3$ crystals was found to be important. To investigate the dependence of polarization within the bulk of the semiconductor on the orientation of the crystallographic plates relative to the direction of the applied electric field, we fabricated detectors by sectioning the crystal in both parallel and perpendicular growth directions (in certain crystallographic orientations). FIG. 8 shows an image of the $CsPbBr_3$ crystal and is marked with perpendicular (area 1) and parallel (area 2) samples. Detectors are typically fabricated using sections of the boule cut in a direction perpendicular 1 to the crystal growth direction. However, the detectors fabricated from the parallel direction 2 demonstrated stable γ-response peaks under varying biases up to 1,000 V.

Figure 9:
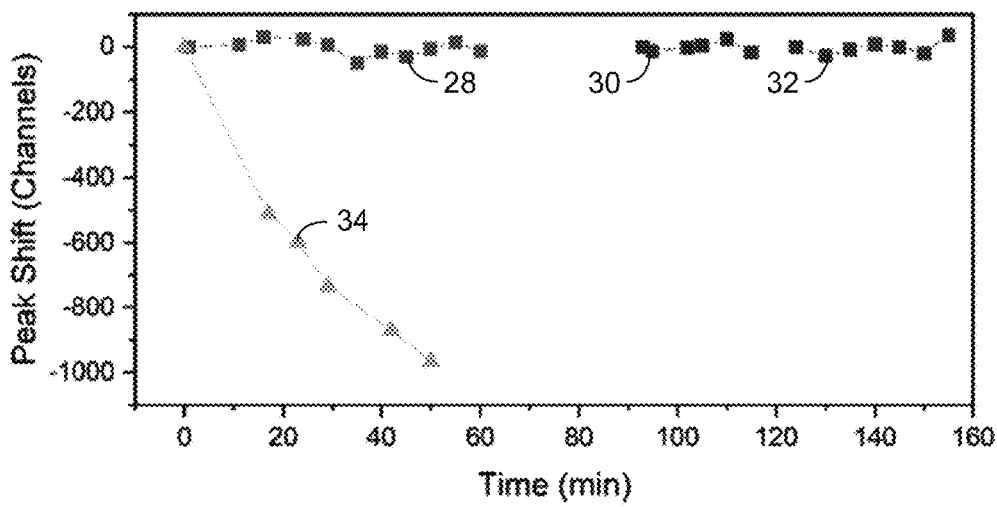
FIG. 9 includes plots that illustrate the stability of the gamma spectrum photopeak position of detectors fabricated from parallel and perpendicular cuts of the $CsPbBr_3$ crystal.
Figure 10:
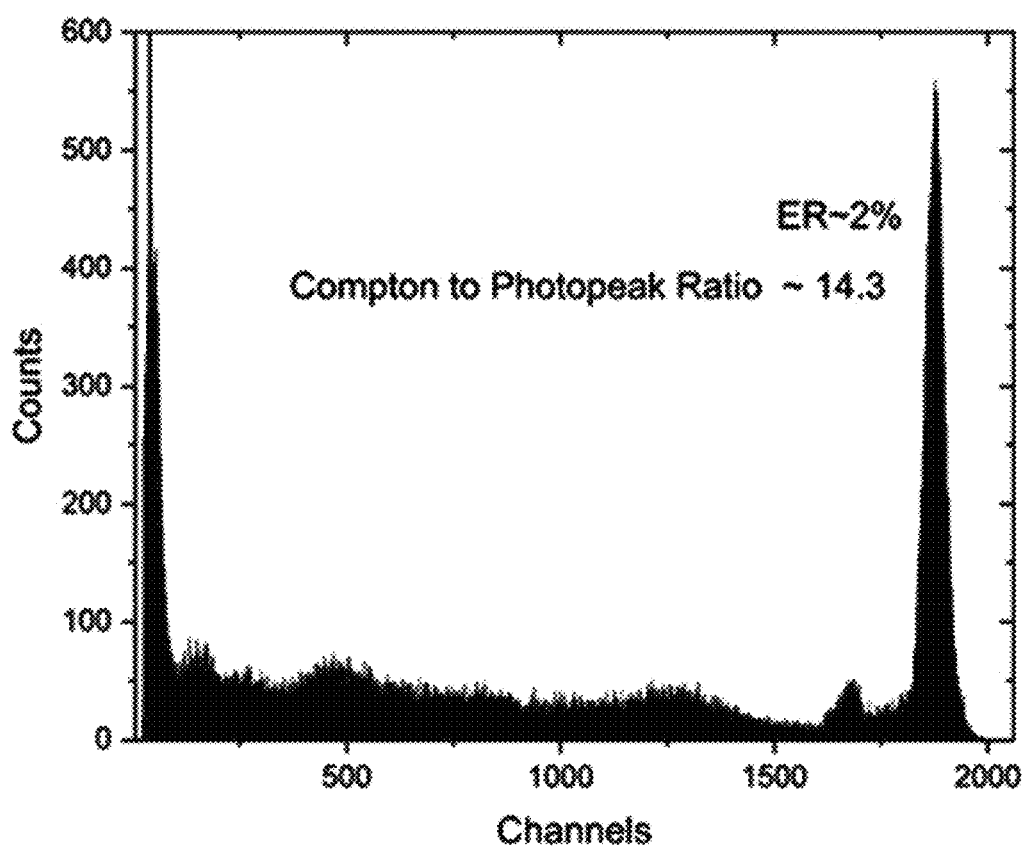
FIG. 10 is a plot showing the $^{137}Cs$ response from a $CsPbBr_3$ planar detector with a guard-ring, showing a 662-keV energy resolution of 2%.

In order to demonstrate the stable performance of these detectors, we applied different electric fields and monitored the shifts in the 662-keV centroid for the parallel detector. As shown in the plot of FIG. 9, the detector was continuously kept under bias, starting from a −700V bias 28, and demonstrated stability for 60 minutes. The bias was then lowered to −100V 30 and finally raised to 1,000V 32. The sample showed stable photopeaks for the entire duration of this experiment under varying applied biases, as seen in FIG. 9. In contrast, the perpendicular detector 34 from the same crystal (with a bias of 150 V) shows a rapidly changing peak position. This difference may be attributed to orientation-dependent migration barriers, diffusion rates of migrating ions, surface-defect density and Schottky contact quality. Differences in the linear atomic density within the lattice structure results in varying diffusion rates and results in anisotropic electronic properties in the bulk crystal. By fabricating detectors from samples sectioned parallel to the crystal-growth direction, stable high ER photopeaks were obtained, as shown in FIG. 10.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step. Likewise, a single element or step may be replaced with a plurality of elements or steps that serve the same purpose. Further, where parameters for various properties or other values are specified herein for embodiments of the invention, those parameters or values can be adjusted up or down by $1/100^{th}$, $1/50^{th}$, $1/20^{th}$, $1/10^{th}$, $1/5^{th}$, $1/3^{rd}$, $1/2$, $2/3^{rd}$, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof or within a range of the specified parameter up to or down to any of the variations specified above (e.g., for a specified parameter of 100 and a variation of $1/100^{th}$, the value of the parameter may be in a range from 0.99 to 1.01), unless otherwise specified. Moreover, while this invention has been shown and described with references to particular embodiments thereof, those skilled in the art will understand that various substitutions and alterations in form and details may be made therein without departing from the scope of the invention. Further still, other aspects, functions, and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety for all purposes; and all appropriate combinations of embodiments, features, characterizations, and methods from these references and the present disclosure may be included in embodiments of this invention. Still further, the components and steps identified in the Background section are integral to this disclosure and can be used in conjunction with or substituted for components and steps described elsewhere in the disclosure within the scope of the invention. In method claims (or where methods are elsewhere recited), where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A radiation detector, comprising:
   a halide semiconductor, comprising at least one halide component that enables spectroscopic radiation detection, wherein the at least one halide component comprises metal and halogen ions, and wherein the halide semiconductor includes a first side and a second side;
   a cathode attached at the first side of the halide semiconductor;
   an anode attached at the second side of the halide semiconductor such that the halide semiconductor is sandwiched between the cathode and the anode, wherein the anode comprises a composition selected from the following:
   a) an electrically conducting inorganic-oxide composition;
   b) an electrically conducting organic composition; and
   c) an organic-inorganic hybrid composition; and
   a buffer layer between the halide semiconductor and the anode, wherein the buffer layer comprises a composition distinct from the composition of the anode and selected from the following:
   a) a composition including at least one other electrically conducting inorganic-oxide composition, electrically conducting organic composition, or organic-inorganic hybrid composition;
   b) a semi-insulating layer selected from:
      i) a polymer-based composition;
      ii) a perovskite-based composition;
      iii) an oxide-semiconductor composition;
      iv) a polycrystalline halide semiconductor;
      v) a carbide, nitride, phosphide, or sulfide semiconductor; and
      vi) a group II-VI or III-V semiconductor; and
   c) a component metal of the halide semiconductor.

2. The radiation detector of claim 1, wherein the anode comprises the electrically conducting inorganic-oxide composition.

3. The radiation detector of claim 2, wherein the electrically conducting inorganic-oxide composition is selected from:
   $(In_2O_3)_x$—$(SnO_2)_y$ (where x and y each are in a range from 0-1);
   fluorine-doped tin oxide (FTO);
   $Sn_2O_3$ (with dopant: F, Mo, Zr, Pt, or W);
   zinc oxide (with dopant: Al, Na, Mo, or Mn);
   $A_xO_y$ (where A: Li, Na, Mg, Al, K, Ca, Ti, V, Cr, Mn, Co, Ni, Cu, Zn, Ga, Sr, Y, Zr, Nb, Mo, Ru, Ta, W, Pt, Hg, La, Ce, Sm, Eu, Gd, or Dy, and where x=1 or 2, and where y=1, 2, or 3);
   NiO (with dopant: Li);
   $TiO_2$ (with dopant: Nb);
   $Cr_2O_3$ (with dopant: Mg or N);
   $CuCrO_2$ (with dopant: Mg);
   $Mg_{1-x}Zn_xO$ (with dopant: Al or In);
   $A_xB_yO_z$ (where A=Cu, Ag, Pd, Pt; B=Fe, Co, Cr, Sr, Ba, Al, Ga, In, Sc, Y, or La, and where the dopant is Ca, Mg, K, or Sn);
   $CuA_xSb_{1-x}O_y$ (where A=Mn, Co, Ni, Zn, or Mg); and
   $CuCr_{1-x}A_xO_2$.

4. The radiation detector of claim 1, wherein the anode comprises a conductive polymer.

5. The radiation detector of claim 4, wherein the conductive polymer is selected from:
   polyacetylene doped with at least one dopant selected from $I_2$, $Br_2$, Li, Na, and $AsF_5$;
   poly(3-alkylthiophene) doped with a dopant selected from $BF_4^-$ and $ClO_4^-$;
   polyphenylene vinylene doped with $AsF_5$;
   polypyrrole doped with a dopant selected from $BF_4^-$, $ClO_4^-$;
   polythiophene doped with a dopant selected from $BF_4^-$ and $ClO_4^-$;
   polyaniline doped with HCl;

polyphenylene doped with Na, Li, and $AsF_5$;
polyphenylene sulfide doped with $AsF_5$;
polyfuran doped with a dopant selected from $BF_4^-$ and $ClO_4^-$;
polyazulene doped with a dopant selected from $BF_4^-$ and $ClO_4^-$;
poly(triaryl amine); and
polystyrene.

6. The radiation detector of claim 1, wherein the anode comprises a conductive organic composition selected from:
a graphene-based composition;
a carbon-nanotube-based composition;
a fullerene-based composition; and
2,2',7,7'-Tetrakis-(N,N-di-4-methoxyphenylamino)-9,9'-spirobifluorene.

7. The radiation detector of claim 1, wherein the anode comprises the organic-inorganic hybrid composition.

8. The radiation detector of claim 1, wherein the buffer layer comprises the polymer-based composition.

9. The radiation detector of claim 8, wherein the polymer-based composition is selected from a polyimide, polybenzoxazole, polymethyl methacrylate, polyvinyl toluene, and a poly(p-xylylene) composition.

10. The radiation detector of claim 1, wherein the buffer layer comprises the perovskite-based composition.

11. The radiation detector of claim 10, wherein the perovskite-based composition is selected from:
a polyimide-perovskite composite;
a polystyrene-perovskite composite; and
a conductive polymer-perovskite composite.

12. The radiation detector of claim 1, wherein the buffer layer comprises the oxide semiconductor.

13. The radiation detector of claim 12, wherein the oxide semiconductor is selected from $TiO_2$, $Cu_2O$, $CuO$, $UO_2$, $UO_3$, $Bi_2O_3$, $SnO_2$, $BaTiO_3$, $SrTiO_3$, $LiNbO_3$, $La_2CuO_4$, $VO_2$, $ZnO$, and AZO.

14. The radiation detector of claim 1, wherein the buffer layer comprises the halide semiconductor, wherein the halide semiconductor is selected from $BiI_3$, $HgI_2$, and $PbI_2$.

15. The radiation detector of claim 1, wherein the buffer layer comprises the semi-insulating layer selected from the carbide, nitride, phosphide, or sulfide semiconductor.

16. The radiation detector of claim 1, wherein the buffer layer comprises the Group II-VI or III-V semiconductor.

17. The radiation detector of claim 1, wherein the anode has a segmented structure.

18. The radiation detector of claim 1, wherein the halide component is selected from TlX; $BiX_3$; $HgX_2$; and $ABX_3$, where A is a cation, where B is at least one divalent metal cation, and where X is selected from at least one of Cl, Br, and I.

19. The radiation detector of claim 18, wherein the halide component includes $ABX_3$, and where $ABX_3$ is selected from at least one of cesium lead bromide ($CsPbBr_3$) and methylammonium lead bromide ($MAPbBr_3$).

20. The radiation detector of claim 18, wherein the halide component includes $ABX_3$, and where A is selected from an aliphatic ammonium, an aromatic ammonium, and a metal ion.

21. The radiation detector of claim 18, wherein the halide component includes $ABX_3$, and where A is cesium ion.

22. The radiation detector of claim 18, wherein the halide component includes $ABX_3$, and where B is selected from at least one of the following divalent metals: $Bi^{2+}$, $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, and $Yb^{2+}$.

23. A method for detecting radiation, comprising:
receiving radiation with a radiation detector, wherein the radiation detector comprises a halide semiconductor, comprising at least one halide component that enables spectroscopic radiation detection, wherein the at least one halide component comprises metal and halogen ions, and wherein the halide semiconductor includes a first side and a second side; a cathode attached at the first side of the halide semiconductor; an anode attached at the second side of the halide semiconductor such that the halide semiconductor is sandwiched between the cathode and the anode, wherein the anode comprises a composition selected from the following: (a) an electrically conducting inorganic-oxide composition, (b) an electrically conducting organic composition, and (c) an organic-inorganic hybrid composition; and a buffer layer between the halide semiconductor and the anode, wherein the buffer layer comprises a composition distinct from the composition of the anode and selected from the following: (a) a composition including at least one other electrically conducting inorganic-oxide composition, electrically conducting organic composition, or organic-inorganic hybrid composition and (b) a semi-insulating layer selected from: (i) a polymer-based composition, (ii) a perovskite-based composition, (iii) an oxide-semiconductor composition, (iv) a halide semiconductor, (v) a carbide, nitride, phosphide, or sulfide semiconductor, and (vi) a group II-VI or III-V semiconductor;
capturing incident radiation with the halide semiconductor and generating electron-hole pairs via a photoelectric effect;
applying an electric bias across the halide semiconductor via generation of a voltage potential between the anode and the cathode across the halide semiconductor to direct electrons to the anode and to direct holes to the cathode; and
while capturing the incident radiation and applying the electric bias, detecting a change in an electronic charge in at least one of the anode and cathode and identifying the incidence of radiation in the halide semiconductor based on the detected change in radiation.

24. The method of claim 23, wherein the halide component is selected from TlX; $BiX_3$; $HgX_2$; and $ABX_3$, where A is a cation, where B is at least one divalent metal cation, and where X is selected from at least one of Cl, Br, and I.

25. The method of claim 23, wherein the halide semiconductor is fabricated and positioned with a lowest-polarization crystallographic orientation that reduces effects of electro-migration and polarization when it captures incident radiation in comparison with other crystallographic orientations.

26. The method of claim 25, wherein the electric bias is applied across the halide semiconductor along the lowest-polarization crystallographic directions.

27. The method of claim 26, wherein the halide semiconductor is in the form of crystals grown in an excess-halide atmosphere to reduce halide-vacancies in the crystals.

28. The method of claim 27, wherein the crystals comprise $CsPbBr_3$.

29. The method of claim 26, wherein the halide semiconductor is in the form of $CsPbBr_3$ crystals doped with a passivating dopant that reduces the effects of polarization by passivating defect propagation pathways.

30. The method of claim 29, wherein the passivating dopant includes Cl and TlBr.

31. The method of claim 27, wherein the halide semiconductor is in the form of $CsPbBr_3$ crystals, and wherein at least one of the anode and cathode comprises a component element of the CsPbBr$_3$ crystals.

32. The method of claim 26, wherein the halide semiconductor is doped with a dopant that changes the bandgap of the halide semiconductor to reduce polarization induced by charge accumulation near Schottky barriers.

\* \* \* \* \*